(12) United States Patent
Dutarde et al.

(10) Patent No.: US 7,170,199 B2
(45) Date of Patent: *Jan. 30, 2007

(54) MATRIX CONVERTER FOR TRANSFORMING ELECTRICAL ENERGY

(75) Inventors: Emmanuel Dutarde, Aureilhan (FR); Christophe Beuille, Aureilhan (FR); Fabrice Breit, Campan (FR); Henri Schneider, Toulouse Cedex 7 (FR)

(73) Assignee: Alstom, Paris (FR)

( * ) Notice: Subject to any disclaimer, the term of this patent is extended or adjusted under 35 U.S.C. 154(b) by 851 days.

This patent is subject to a terminal disclaimer.

(21) Appl. No.: 10/337,868

(22) Filed: Jan. 8, 2003

(65) Prior Publication Data

US 2003/0160516 A1   Aug. 28, 2003

(30) Foreign Application Priority Data

Jan. 17, 2002 (FR) .................................. 02 00551

(51) Int. Cl.
*H02M 5/06* (2006.01)
*H02B 1/24* (2006.01)

(52) U.S. Cl. ........................................ 307/112; 363/37
(58) Field of Classification Search ................. 307/112
See application file for complete search history.

(56) References Cited

U.S. PATENT DOCUMENTS 3,587,052 A * 6/1971 Metcalf ....................... 327/564
5,361,188 A * 11/1994 Kondou et al. ............. 361/695
6,181,231 B1   1/2001 Bartilson
6,262,878 B1 * 7/2001 Shirashige et al. ......... 361/508
6,453,083 B1 * 9/2002 Husain et al. ................ 385/17
6,781,854 B1 * 8/2004 Dutarde et al. ............... 363/37
2001/0026427 A1  10/2001 Mahlein et al.

FOREIGN PATENT DOCUMENTS

WO    WO 99/67798 A   12/1999
WO    WO 01 47023 A    6/2001

OTHER PUBLICATIONS

Krishnan, M. et al., "Fast opening diamond switch for high voltage, high average power inductive energy store modulators" Pulsed Power Conference, 1999, Digest Technical Papers. 12th IEEE International Monterey, CA, USA Jun. 27-30, 1999, Piscataway, NJ, USA, IEEE US Jun. 27, 1999, pp. 1222-1225, XP010371514.

Prasad, R. R. et al., "Optically triggered diamond switches" Pulsed Power Conference, 1999, Digest of Technical Papers, 12th IEEE International Monterey, CA, USA, Jun. 27-30, 1999, Piscataway, NJ, USA, IEEE, US, Jun. 27, 1999, pp. 142-145, XP010371252.

* cited by examiner

*Primary Examiner*—Burton S. Mullins
(74) *Attorney, Agent, or Firm*—Sughrue Mion, PLLC

(57) ABSTRACT

A matrix converter for transforming electrical energy between at least one voltage source, in particular a power supply network, and at least one current source, in particular a load, said converter including a matrix of switches connecting said voltage sources to said current sources, wherein each of said switches has two terminals which are interconnected via a photoconductive layer of diamond, each switch being controlled by means of a light source irradiating the layer of diamond interposed between the two terminals of the switch.

11 Claims, 3 Drawing Sheets

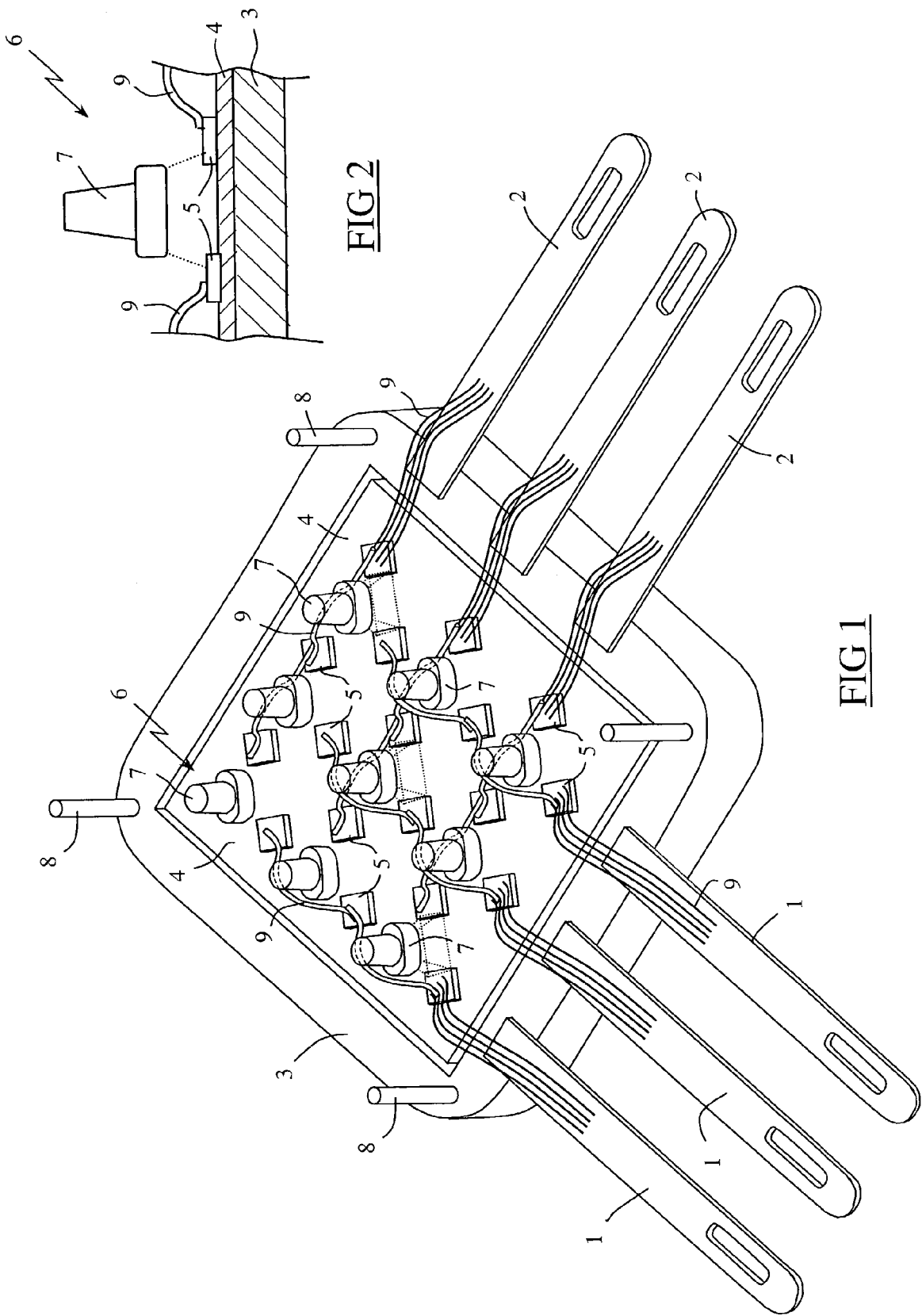

MATRIX CONVERTER FOR TRANSFORMING ELECTRICAL ENERGY

The invention relates to a matrix converter for transforming electrical energy between a voltage source, such as a power supply network, and a current source, such as a motor. The invention is particularly applicable to controlling traction motors in the field of railways.

BACKGROUND OF THE INVENTION patent application U.S. 2001/0026427 A1 discloses a matrix converter comprising a 3×3 matrix made up of both-way switches for powering an asynchronous motor from a three-phase network. By means of its modular topology, such a matrix converter offers the advantage of making it possible for a given alternating current (AC) to be converted directly into AC at a different voltage and at a different frequency by appropriately controlling the various switches, unlike the fixed-structure converters that are usually used and which require an AC-to-DC rectifier, a DC-to-DC chopper, and a DC-to-AC uninterruptible power supply (UPS) to be associated in series and to be combined with filter capacitors in order to obtain the same result.

However, in such a matrix converter, the both-way switches are constituted by associating diodes and Integrated Gate Bipolar Transistor (IGBT) components, which suffer from the drawback of not being capable of withstanding high voltages, since the most robust IGBT components that are currently commercially available are limited to an operating voltage of about 6.5 kV. In addition, such an IGBT component suffers from the drawback of having a control gate that must be isolated from its collector and from its emitter, which poses problems when the voltage across the terminals of the IGBT component becomes high.

OBJECTS AND SUMMARY OF THE INVENTION

Therefore, an object of the present invention is to provide a matrix converter of a novel type that can operate at high voltages. Another object of the invention is to provide a matrix converter in which switch control is naturally isolated from the terminals of said switches.

To this end, the invention provides a matrix converter for transforming electrical energy between at least one voltage source, in particular a power supply network, and at least one current source, in particular a load, said converter including a matrix of switches connecting said voltage sources to said current sources, wherein each of said switches has two terminals which are interconnected via a photoconductive layer of diamond, each switch being controlled by means of a light source irradiating the layer of diamond interposed between the two terminals of the switch.

In particular embodiments, the matrix converter of the invention may have one or more of the following characteristics taken in isolation or in any technically feasible combination:

the terminals of the matrix of switches are disposed in the same plane;

the layer of diamond of the switch is constituted by a diamond substrate obtained by a chemical vapor deposition (CVD) method;

the terminals are formed by metal-plating the diamond substrate by vapor deposition of titanium, platinum, and gold in succession;

the light source is an ultraviolet source;

a single diamond substrate supports all of the terminals of the matrix of switches;

each switch of the converter is formed by an individual diamond substrate which is supported by a ceramic substrate, the individual diamond substrate being bonded to the supporting ceramic substrate via a layer of glass;

each switch has two terminals connected respectively to a voltage source and to a current source via conductor tracks carried by the supporting ceramic substrate;

the ceramic substrate is made of aluminum nitride (AlN); and the ceramic substrate has a face that is opposite from the face supporting the conductor tracks, and that is cooled by a cooling fluid being caused to flow.

BRIEF DESCRIPTION OF THE DRAWINGS

The objects, features, and advantages of the present invention will be better understood on reading the following description of two embodiments of the invention given by way of non-limiting example, with reference to the accompanying drawings, in which:

FIG. 1 is a perspective view of a matrix converter in a particular embodiment of the invention;

FIG. 2 is a section view of a diamond switch of the matrix converter of FIG. 1;

MORE DETAILED DESCRIPTION

Figure 3:
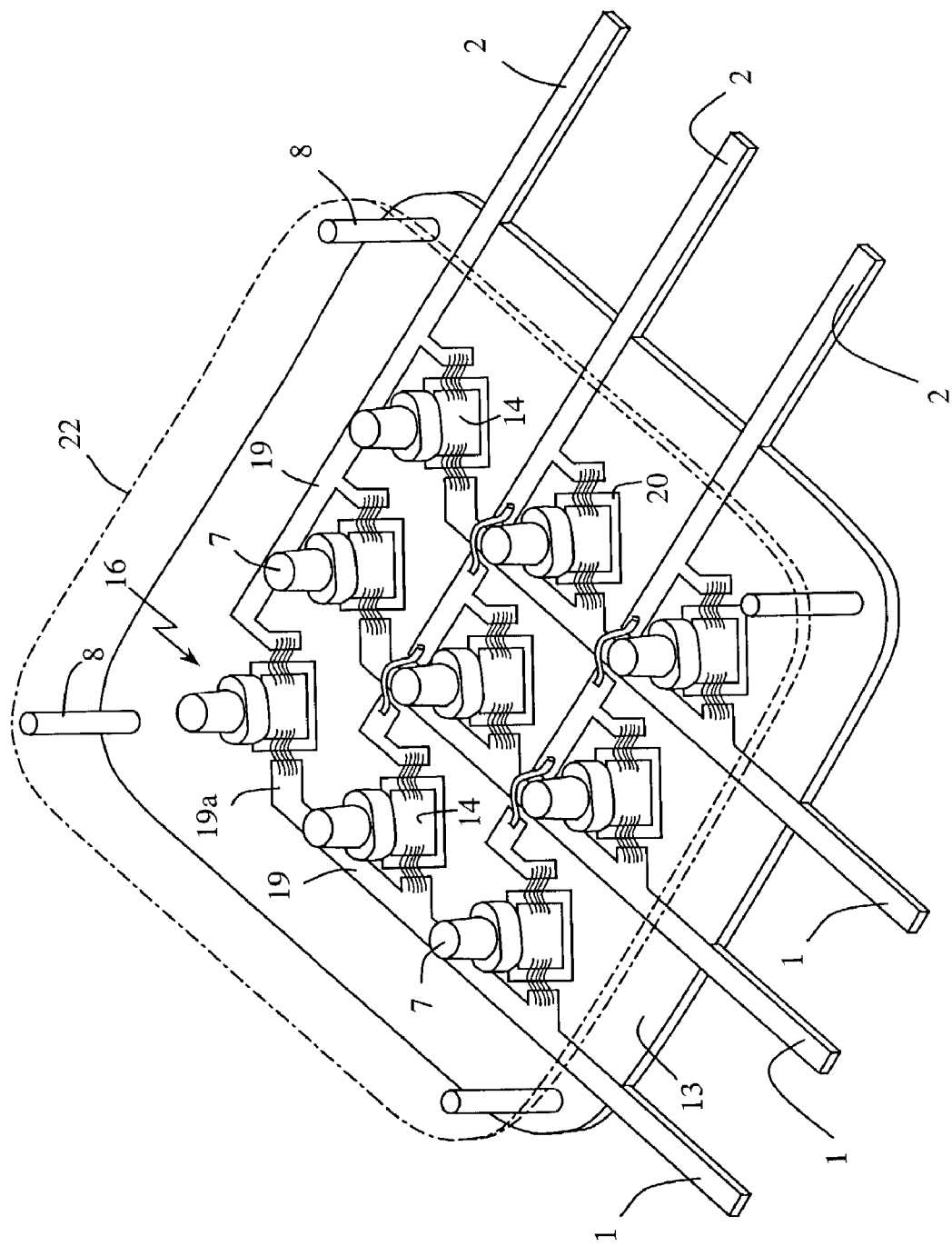
FIG. 3 is a perspective view of a matrix converter in a variant embodiment of the converter of the invention.

To make the drawing clearer, only those elements which are necessary to understand the invention are shown. Like elements are given like references from one figure to another.

FIG. 1 shows a particular embodiment of a matrix converter of the invention. This matrix converter has three inlet connectors 1, which, for example, are to be powered by a three-phase network, and three outlet connectors 2, which, for example, are to supply energy to an asynchronous motor.

As shown in this figure, the matrix converter includes a base 3 that is made of a plastics material, that is substantially square in shape, and that supports a diamond substrate 4 in its center. The diamond substrate 4 is made in a manner known per se by a chemical vapor deposition (CVD) method, and, for example, it has a width of about 150 millimeters (mm) and a thickness of about 50 micrometers (μm).

The diamond substrate 4 has a top face provided with nine pairs of metal-plated terminals 5 arranged in the form of a 3×3 matrix, each pair of metal-plated terminals 5 constituting the terminals 5 of a respective diamond switch 6, which terminals are spaced apart by about 10 mm so as to withstand a high potential difference between said two terminals. For example, such metal-plated terminals 5 may be obtained on the diamond substrate 4 by a metal-plating method comprising the following steps:

depositing a photosensitive resin on the top face of the diamond substrate;

removing the resin from the areas to be metal-plated by exposing them to radiation through a mask;

metal-plating by vapor deposition of titanium, platinum, and gold in succession on the surface of the diamond substrate as covered in part with resin; and removing the remaining resin by dipping the diamond substrate in acetone.

As shown in FIGS. 1 and 2, an ultraviolet light source 7 is disposed facing the gap between the two terminals 5 of each diamond switch 6, each of the light sources 7 having a beam (shown in dotted lines in the figures) making it possible to irradiate the diamond surface 4 between the two terminals 5 of a respective diamond switch 6 on command so as to cause electricity to be conducted between the two terminals 5. The light sources 7 are advantageously supported by a plate (not shown in the figures) mounted on legs 8 carried by the top face of the base 3, and they are controlled independently from one another by a control circuit constituting the control circuit of the converter.

The three inlet connectors 1, and the three outlet connectors 2 of the converter are distributed in register with respective ones of the three rows and of the three columns of the matrix of diamond switches 6, the end of each of the connectors 1 and 2 being supported by the base 3. Each inlet connector 1 is connected electrically via aluminum wires 9 to one of the two terminals 5 of each of the three diamond switches 6 disposed in alignment with the inlet connector 1, the other terminal 5 of the diamond switch 6 being connected to the outlet connector 2 disposed in register with the column containing the diamond switch 6.

Such a matrix converter offers the advantage of having diamond switches that can withstand high voltages across their terminals, and that naturally enable electricity to flow in either direction through the converter. In addition, such a converter is controlled by optically controlling the diamond switches, such control offering the advantage of being naturally isolated from the electrical potential across the terminals of the switch. Finally, since its topology is made modular by means of the optical control, such a matrix converter makes any type of conversion possible, such as single-phase or three-phase direct AC-to-AC conversion, or AC-to-DC conversion, or DC-to-DC conversion when it is connected to a DC voltage source.

FIG. 3 shows a variant embodiment of the converter of the invention. As shown in this figure, the matrix converter includes a ceramic substrate 13 made of aluminum nitride AlN and on which three inlet connectors 1 and three outlet connectors 2 are mounted. The ceramic substrate 13 is provided with nine cavities distributed in a 3×3 matrix pattern, each cavity containing a square diamond substrate 14 with sides of about 10 mm surrounded by glass 20 as shown in more detail in FIG. 4. The glass zone 20, optionally filled with ceramic, forms an interface between the diamond substrate 14 and the ceramic substrate 13, which offers the advantage of having an expansion coefficient α close to 3.5, making it possible to attenuate the forces caused by the differential expansion between the diamond ($\alpha=1$) and the AlN substrate ($\alpha=4.5$).

Figure 4:
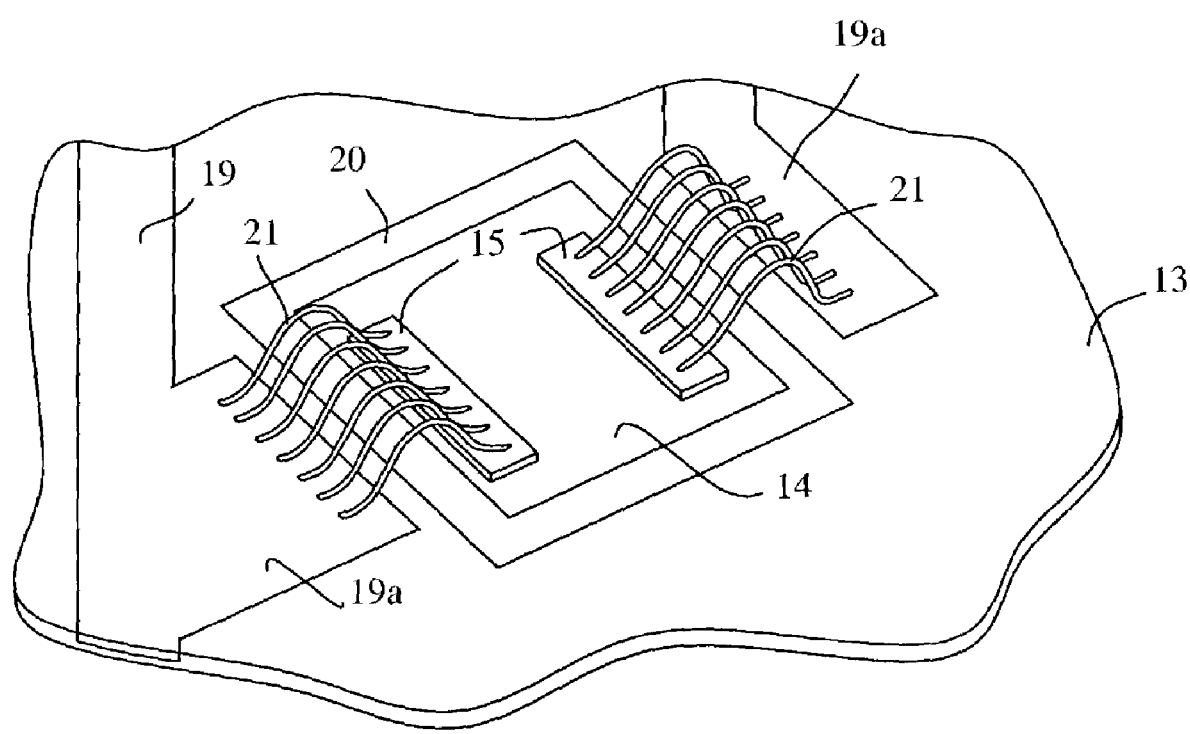
FIG. 4 is a detail view of a diamond switch of the converter of FIG. 3.

As shown in FIG. 4, each diamond substrate 14 is provided with two metal-plated terminals 15 disposed at two diametrically opposite points, which terminals 15 constitute the two terminals of a diamond switch 16, and are connected via aluminum wires 21 to respective ones of two connection tabs 19a carried by the AlN substrate 13 at the periphery of the layer of glass 20. The connection tabs 19a are connected to conductor tracks 19 formed by metal-plating the surface of the AlN substrate 13, the tracks 19 being organized so that they connect an inlet connector 1 to one of the terminals 15 of each of the three diamond switches 16 disposed along the same row of the matrix, the other three terminals 15 of the diamond switches 16 being connected to respective ones of the three outlet connectors 2.

Ultraviolet light sources 7 (shown in FIG. 3 only) are disposed facing respective ones of all of the diamond substrates 14, it being possible for each light source 7 to act on command to irradiate the gap between the two terminals 15 of a respective diamond switch 16 in order to cause electricity to be conducted between said two terminals 15. The light sources 7 are advantageously supported by a plate 22 shown in chain-dotted lines in FIG. 3 and mounted on legs 8 carried by the top face of the ceramic substrate 13, the light sources 7 being controlled individually by a control circuit.

The bottom face of the ceramic substrate 13 is advantageously swept by a cooling fluid channeled by a manifold (not shown in the figures) making it possible to remove the heat given off at the diamond switches 16 while the matrix converter is operating. In which case, the thickness of the diamond substrates is adapted to the operating voltage of the converter, and may, for example, vary from a thickness of 50 µm, for withstanding a potential difference between the terminals of the diamond switch and the cooling fluid of about 5 kV, to a thickness of 200 µm for withstanding a potential difference of about 20 kV.

Such a variant embodiment offers the advantage of requiring a smaller diamond substrate area than that required by the embodiment of FIG. 1, thereby making it possible to reducing the cost of manufacturing such a converter.

The converter of the invention may advantageously be used to control a traction motor for a rail vehicle using a catenary voltage, its modular topology enabling it to adapt to various types of catenary voltage merely by modifying its control of the diamond switches.

Naturally, the invention is in no way limited to the embodiment described and shown, which is given merely by way of example. Modifications remain possible, in particular concerning the make up of the various elements, or the use of equivalent substitute techniques, without going beyond the scope of protection of the invention.

The invention claimed is:

1. A matrix converter for transforming electrical energy between at least one voltage source and at least one current source, said converter including a matrix of switches connecting said voltage sources to said current sources, wherein each of said switches has two terminals which are interconnected via a photoconductive layer of diamond, each switch being controlled by means of a light source irradiating the layer of diamond interposed between the two terminals of the switch, and wherein the photoconductive layer of diamond of each switch is supported by a ceramic substrate.

2. A matrix converter according to claim 1, wherein said terminals of the matrix of switches are disposed in the same plane.

3. A matrix converter according to claim 1, wherein said layer of diamond of the switch is constituted by a diamond substrate obtained by a chemical vapor deposition method.

4. A matrix converter according to claim 3, wherein the terminals are formed by metal-plating the diamond substrate by vapor deposition of titanium, platinum, and gold in succession.

5. A matrix converter according to claims 3 or 4, wherein said light source is an ultraviolet source.

6. A matrix converter according to claims 3 or 4, wherein a single diamond substrate supports all of the terminals of the matrix of switches.

7. A matrix converter according to claims 1, 2, 3 or 4, wherein each switch of the converter is formed by an individual diamond substrate which is supported by the ceramic substrate, said individual diamond substrate being bonded to the supporting ceramic substrate via a layer of glass.

8. A matrix converter according to claim 7, wherein each switch has two terminals connected respectively to a voltage source and to a current source via conductor tracks carried by said supporting ceramic substrate.

9. A matrix converter according to claim 6, wherein said ceramic substrate is made of aluminum nitride.

10. A matrix converter according to claim 7, wherein said ceramic substrate has a face that is opposite from the face supporting the conductor tracks, and that is cooled by a cooling fluid.

11. A matrix converter according to claim 1, wherein the voltage source is a power supply network and the current source is a load.

* * * * *